(12) United States Patent
Matsumoto

(10) Patent No.: US 6,490,713 B2
(45) Date of Patent: Dec. 3, 2002

(54) METHOD AND APPARATUS FOR AUTOMATICALLY GENERATING MULTI-TERMINAL NETS, AND PROGRAM STORAGE MEDIUM STORING PROGRAM FOR EXECUTING AUTOMATIC MULTI-TERMINAL NET GENERATION METHOD

(75) Inventor: Hiroyuki Matsumoto, Sagamihara (JP)

(73) Assignee: International Business Machines Corporation, Armonk, NY (US)

( * ) Notice: Subject to any disclaimer, the term of this patent is extended or adjusted under 35 U.S.C. 154(b) by 61 days.

(21) Appl. No.: 09/770,356

(22) Filed: Jan. 26, 2001

(65) Prior Publication Data

US 2001/0018760 A1 Aug. 30, 2001

(30) Foreign Application Priority Data

Jan. 26, 2000 (JP) .......................... 2000-016423

(51) Int. Cl.[7] .............................. G05F 17/50
(52) U.S. Cl. ........................... 716/12; 716/14
(58) Field of Search ........................ 716/1–14

(56) References Cited

U.S. PATENT DOCUMENTS

| | | | | |
|---|---|---|---|---|
| 5,402,359 A | * | 3/1995 | Oyanagi ...................... | 716/12 |
| 5,583,788 A | * | 12/1996 | Kuribayashi ................. | 257/208 |
| 5,880,969 A | * | 3/1999 | Hama et al. .................. | 716/12 |
| 5,987,743 A | * | 11/1999 | Yui .............................. | 29/755 |
| 6,218,202 B1 | * | 4/2001 | Yew et al. .................... | 257/48 |
| 6,219,823 B1 | * | 4/2001 | Hama et al. .................. | 716/12 |
| 6,262,487 B1 | * | 7/2001 | Igarashi et al. ............. | 257/459 |
| 6,295,634 B1 | * | 9/2001 | Matsumoto .................. | 703/2 |
| 6,385,758 B1 | * | 5/2002 | Kikuchi et al. ............... | 716/2 |

FOREIGN PATENT DOCUMENTS

JP 411296560 A * 10/1999 ........... G06F/17/50

OTHER PUBLICATIONS

Jun Dong Cho, "Wiring space and length estimation in two–dimensional arrays", May 2000, IEEE Transactions on Computer–Aided Design of Integrated Circuits and Systems, vol. 19, iss. 5, pp. 612–615.*

Parks et al., "An algorithm for embedding a class of non–even routing problems in even routing problems", 1991, IEEE Proceddings on the Second Great Lakes Symposium on VLSI, 1992, pp. 152–158.*

Maddila et al., "Routing in general junctions", Nov. 1989, IEEE Transactions on Computer–Aided Design of Integrated Circuits and Systems, vol. 8, iss. 11, pp. 1174–1184.*

* cited by examiner

Primary Examiner—Vuthe Siek
Assistant Examiner—Sun James Lin

(57) ABSTRACT

To automatically generate N-terminal (N is equal to or greater than three) nets according to the present invention, connection data of (N−1) terminals which satisfies a predetermined design rule for a package is input as initial data, and two-terminal nets are generated for a group of wiring start terminals and a group of N-th terminals to which nets are to be generated, in which an intermediate terminal group is ignored. Then, the initial data is combined with the result of the two-terminal generation process to thereby generate provisional nets, and the generated provisional nets are modified so that the design rule for the package is satisfied. In this way, the N-terminal nets are generated automatically.

18 Claims, 10 Drawing Sheets

○ PIN
◉ PAD
● PLATED TERMINAL

—— SIDE IF DELAUNAY TRIANGULATION

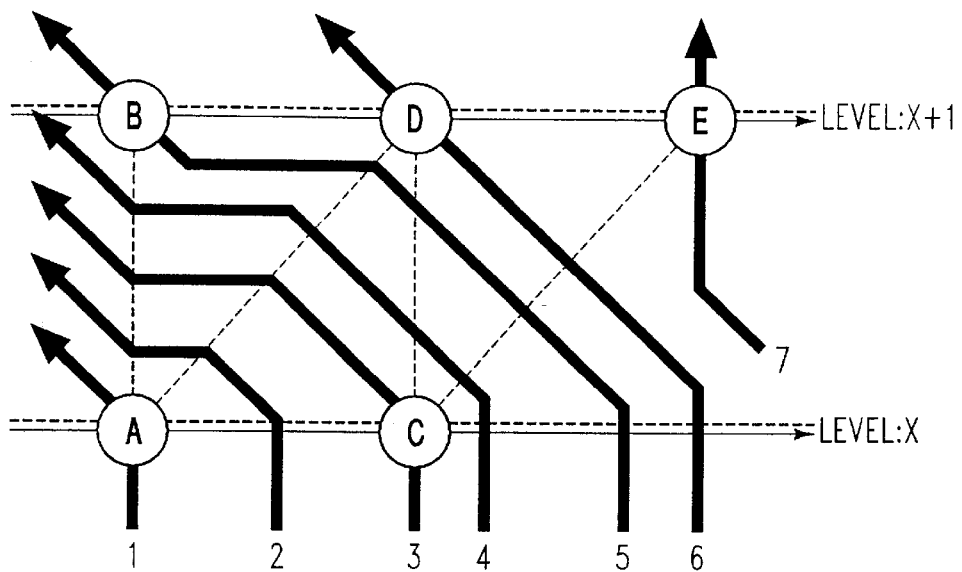
FIG. 11A      -------- TRIANGULATION SIDE
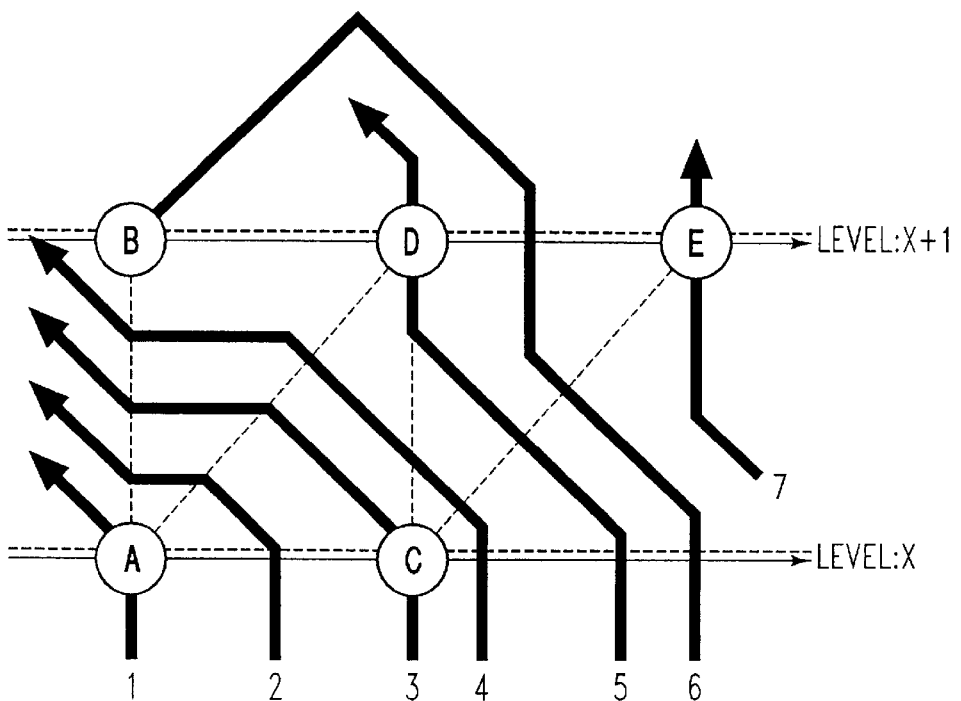
FIG. 11B      -------- TRIANGULATION SIDE

METHOD AND APPARATUS FOR AUTOMATICALLY GENERATING MULTI-TERMINAL NETS, AND PROGRAM STORAGE MEDIUM STORING PROGRAM FOR EXECUTING AUTOMATIC MULTI-TERMINAL NET GENERATION METHOD

FIELD OF THE INVENTION

The present invention relates to automatic generation of multi-terminal nets for a package such as a semiconductor chip package, and more particularly to a technique for automatically generating multi-terminal nets formed with one stroke so that those nets can be wired in a single-chip package without any redundant route.

BACKGROUND ART

Chip package parts represented by CPUs and ASICs have been enhanced significantly in both speed and packing density due to the progress of packaging techniques. The packaging is one of elementary techniques for effectively making electronic devices higher in performance and smaller in size in recent years. Under such circumstances, a high-performance automatic design system is an indispensable tool in product development fields now that products are getting diversified more and more and their life cycles are becoming shorter and shorter.

Wiring in a chip package is one of such automatic designs. This wiring is divided into two types; net wiring that derives each wiring route according to predetermined connection directive information (net(s)) and net generation that derives each wiring route while generating the connection directive information which can be wired. The present invention is applied to the latter wiring process.

Generally, wiring in a package is done radially from a terminal (bonding pad) group disposed at a bear chip (chip body) side located in the center toward a pin group (or interlayer connecting parts referred to as vias) arrayed at the outer periphery. Its wiring pattern should satisfy the following conditions.

E It should be connectable.
 E The total wiring length should be as short as possible.
 E It should satisfy the design rules (wiring pitch, gap between the pattern and part, etc.).
 ENo redundant wiring route is allowed.

There is a known technique for implementing the package wiring described above which is referred to as two-terminal net generation algorithm. According to this technique, objects to be wired are divided into two terminal groups (source and sink). A given element in one group is connected to a given element in the other group temporarily by a shortest route searching method such as Dijkstra method, and any intersection of the generated routes is eliminated so as to finally generate nets which can be wired for all objects to be connected. For example, Japanese Patent 2938431 discloses a technique in which design information that indicates pad arrangement on a chip, pin arrangement on a package, correspondence of pads and pins, etc. is read and analyzed to create a wiring problem, pads and pins are classified into source elements and sink elements, the same ID numbers are consecutively assigned to pads and pins interconnected with each other, imaginary triangles having source/sink elements as vertexes are generated by applying the Delaunay's triangulation method to the source and sink elements, the pins are then classified into some levels by using those triangles, it is determined whether or not each side of the triangles crosses a wiring, a wiring route is derived by connecting the sides determined to be crossed, and the result of the wiring design is output.

Japanese Published Unexamined Patent Application 11-296560 discloses another technique in which design information is read and analyzed to create a wiring problem just like the technique disclosed in the above Japanese patent, bonding pads and pins of a semiconductor package are associated with each other, a monitoring side used to monitor a wiring route is created between a given sink element and a wiring inhibited area, a wiring route is searched by, for example, the Dijkstra method in a manner that crossing is allowed, an evaluation value is calculated by weighting the length of a candidate route with a coefficient if it crosses a monitoring side, a candidate route having the lowest evaluation value is selected as a partial route, and the result of wiring is finally output.

As described above, generally, wiring in a single-chip package is done radially from wire bonding pads disposed around a bear chip located in the center of the substrate toward pin parts (including vias) disposed along the outer periphery. The above-described two-terminal net generation algorithm classifies the objects to be connected into a wire bonding pad group (source) and a pin part group (sink) before wiring is done. When designing an actual chip package, however, it is often required to extend a wiring route from a source toward a sink and further to a plated terminal positioned at the outer periphery of the package for some reason of the chip fabrication. In case an attempt is made to automate all the processings up to this extension (to generate three- or more-terminal nets automatically), many problems that are difficult to be solved are expected to arise even when the present combination of the shortest route searching and crossing elimination methods is further expanded. The problems expected would be frequent occurrence of route searching operations depending on objects for intersecting routes (resulting in longer processing time), no assurance of obtaining a solution for connection, etc. Consequently, designers in the field are requested to lay most of lead wires up to these plated terminals manually.

Referring to a simple example shown in FIG. 1, symbols A to F denote parts such as pins or the like disposed between an output terminal (pad) group and an input terminal (plated terminal) group. Arrows lines 1 to 6 denote routes from the output terminal group to the input terminal group via those parts. In case a three-terminal net is configured by automatically generating a two-terminal net simply twice, a route passing through the part D could not be obtained (a net could not be generated) if the wiring capacity between 0the parts C and F is 100%. In that case, all the nets between the parts C and F must be reviewed and modified to wirable nets which would, however, lead to problems such as definition of an optimum net modification method, necessity for route searching, control of, generation of redundant circuitry (detour), and route evaluation. Further, after the net modification, wiring with nets is done in which the solution for connection could not be assured without enough examination of the nets, and the processing is repeated while checking the solution for connection, leading to the conclusion that the processing could be finished more quickly by manual work from the beginning. Of course, the manual work would impose a burden on the designer.

SUMMARY OF THE INVENTION

Accordingly, it is an object of the present invention to derive wirable multi-terminal nets including no redundant route quickly without route searching.

It is another object of the present invention to provide an automatic multi-terminal net generation method for deriving the multi-terminal nets quickly.

It is still another object of the present invention to provide an automatic multi-terminal net generation apparatus for deriving the multi-terminal nets quickly.

It is still another object of the present invention to provide a program storage medium for storing a program used to perform the above automatic multi-terminal net generation method for deriving the multi-terminal nets quickly.

According to the present invention, when N-terminal nets (N is equal to or greater than three) are generated automatically, (N−1)-terminal connection data satisfying a given design rule for a package are input as initial data, and then a two-terminal net generation processing is performed for a group of terminals corresponding to start points of wiring and a group of N-th terminals for which nets are to be generated, with any intermediate terminal group being ignored. Then, provisional nets are generated by combining the initial data with the result of the two-terminal net generation, and these provisional nets are modified to satisfy the design rule for the package. The N-terminal nets are thereby generated automatically. In case the above (N−1) is equal to or greater than three, the connection data to be input as initial data must be generated according to the present invention.

Consequently, the first aspect of the present invention is a method for automatically generating multi-terminal nets, in which said nets are generated sequentially from wiring start terminals toward end terminals in a package including a plurality of terminal groups, said method comprising the steps of:

(a) inputting, as initial data, connection data between a first terminal group including said wiring start terminals and a second terminal group next thereto;

(b) performing two terminal net generation for said first terminal group and a third terminal group positioned next to said second terminal group in which said second terminal group is ignored;

(c) generating provisional nets by combining said initial data with the result of said two-terminal net generation; and (d) modifying said provisional nets so as to satisfy a design rule for said package;

wherein said steps (b) to (d) are repeated for fourth and succeeding terminal groups by inputting, as said initial data, the provisional nets modified in said step (d) if the multi-terminal nets are four- or more-terminal nets.

The second aspect of the present invention is an apparatus for automatically generating multi-terminal nets in which said nets are generated sequentially from wiring start terminals toward end terminals in a package including a plurality of terminal groups, said apparatus comprising:

(a) means for inputting, as initial data, connection data between a first terminal group including said wiring start terminals and a second terminal group next thereto;

(b) means for performing two-terminal net generation for said first terminal group and a third terminal group positioned next to said second terminal group in which said second terminal group is ignored;

(c) means for generating provisional nets by combining said initial data with the result of said two-terminal net generation; and (d) means for modifying said provisional nets so as to satisfy a design rule for said package;

wherein the tow-terminal net generation by said means (b), the generation of the provisional nets by said means (c) and the modification of the provisional nets by said means (d) are repeatedly performed for fourth and succeeding terminal groups by inputting, as said initial data, the provisional nets modified by said means (d) if the multi-terminal nets are four- or more-terminal nets.

The third aspect of the present invention is a program storage medium that stores a program for performing the method for automatically generating multi-terminal nets according to the first aspect.

BRIEF DESCRIPTION OF THE DRAWINGS

FIG. 11 illustrate generation of a redundant route;

PREFERRED EMBODIMENTS OF THE INVENTION

The preferred embodiments of the present invention will now be described with reference to the accompanying drawings. In the following, it is assumed that three-terminal nets are generated starting from the inside (pads) of a package toward the outside (plated terminals). However, the nets may also be generated starting front the outside toward the inside. In addition, four- or more terminal nets may be generated by simply repeating the processes to be described below.

Figure 1:
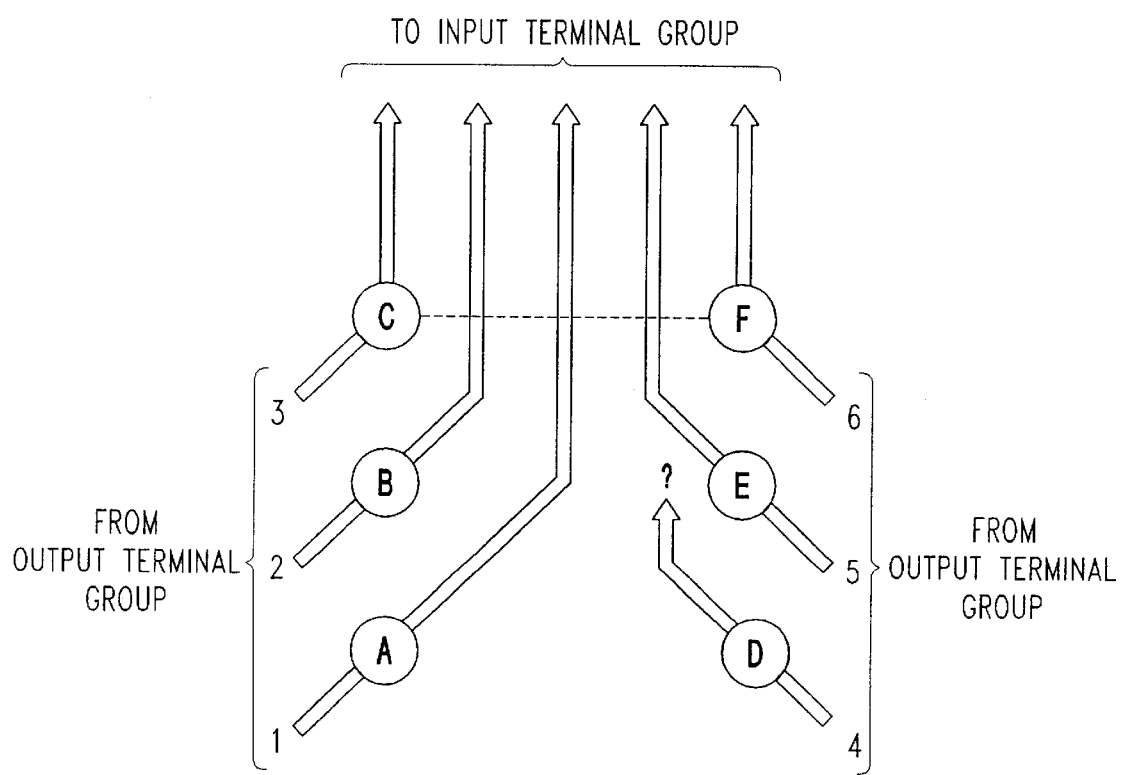
FIG. 1 shows a problem which occurs when the conventional two-terminal net generation technique is applied to the generation of multi-terminal nets.
Figure 2:
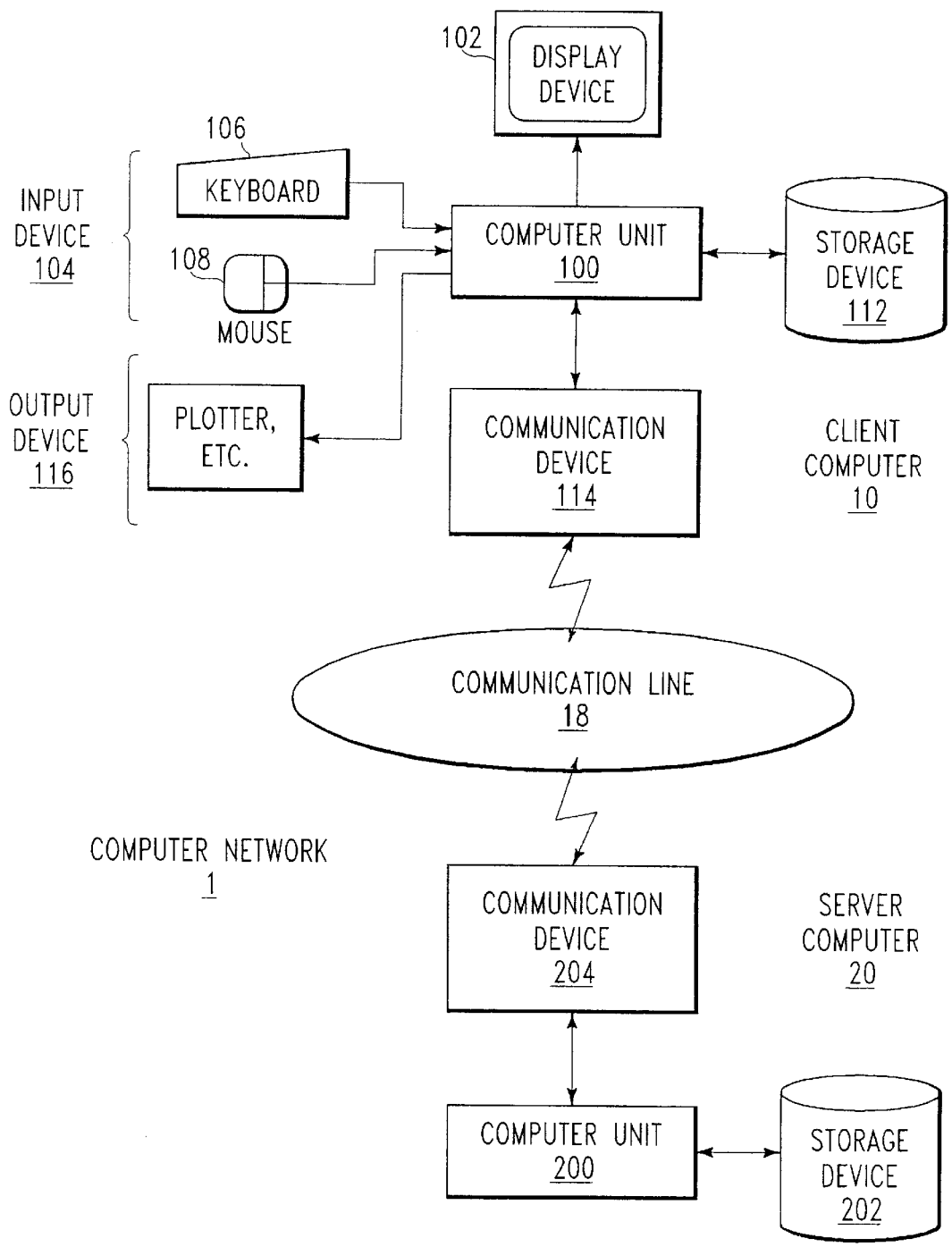
FIG. 2 is a block diagram of a computer network in which the present invention can be implemented.

FIG. 2 illustrates a computer network 1 in which the present invention is implemented. As shown, the computer network 1 comprises n client computers 10, a communication line 18, and a server computer 20 (illustrated in FIG. 1 is a case of n=1). The communication line 18 may be a LAN, leased data line, ISDN line, or telephone line for enabling data communications, and transmits data between the client computers 10 and the server computer 20.

Figure 3:
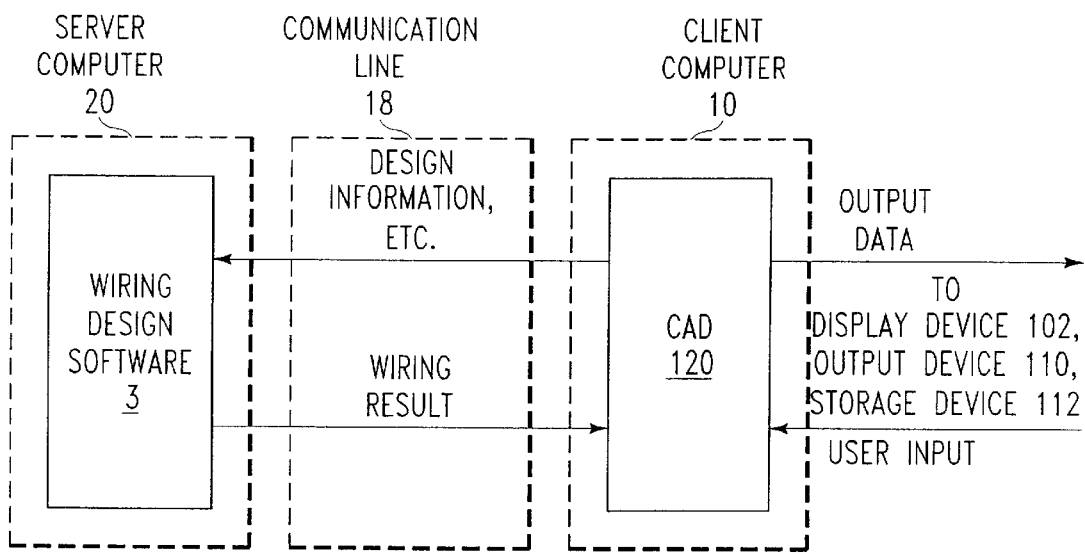
FIG. 3 illustrates how functions are shared between the client computer and the server computer shown in FIG. 2.

FIG. 3 illustrates function sharing between the client computer 10 and the server computer 20 shown in FIG. 2. In FIG. 3, the client computer 10 executes CAD software 120 used to design a semiconductor chip while the server computer 20 executes wiring design software 3 used to automatically generate multi-terminal nets for a semiconductor chip package. It should be noted that the automatic multi-terminal net generation according to the present invention may also be implemented in a configuration in which both of the CAD software 120 and the wiring design software 3 are executed by the same computer, in addition to the configuration illustrated in FIG. 3.

As shown in FIG. 2, the client computer 10 comprises a computer unit 100, a display device 102 such as a CRT display, liquid crystal display or the like, an input device 104, an output device 110 including a printer, plotter, etc., a storage device 112 such as a hard disk drive, magneto-optical (MO) disk drive or the like, and a communication device 114.

The input device 1104 includes a keyboard 106, a mouse 108, etc. and, responsive to user actions, serves to receive and output to the computer unit 100, information necessary for designing a semiconductor circuit or modifying the design, as well as information related to pin assignment of a semiconductor package.

The storage device 112 is used to store the CAD software 120 shown in FIG. 31 information entered via the input device 104, information of a semiconductor circuit designed by the CAD software 120, circuit layout information of the designed semiconductor, circuit realized as an actual semiconductor chip, wiring information transmitted from the server computer 20, etc., and to output the stored data to the computer unit 100 by request.

The communication device 114 is an Ethernet adapter, token ring adapter, FDDI, TA, modem or the like, and performs data transmission between the client computer 10 and the server computer 20 via the communication line 18 under the control of the computer unit 100.

The computer unit 100 comprises of a CPU, a memory, and their peripheral circuits. It has functions of a personal computer or work station and controls each component of the client computer 10. Further, the computer unit 100 loads the CAD software 120 shown in FIG. 2 from the storage device 112 into its memory and executes the software to perform each of the following operations.

The computer unit 100 is used to design semiconductor circuitry according to the information required to design the semiconductor circuit and entered via the input device 104, design layouts0 of circuits and bonding pads of the designed semiconductor circuitry, and output them to the display device 102, the output device 110, and the storage device 112.

The computer unit 100 is also used to transmit part information relating to a plurality of parts (bonding pads, pins, vias, plated terminals, etc.) identified by unique part numbers, 0respectively, design rules for a package for which nets are to be generated, and initial net information to the server computer 20 so as to enable the server computer 20 to generate multi-terminal nets. As described in detail later, the initial net information defines two-terminal nets between wiring start terminals (pads) and intermediate terminals (pins or vias), and may be obtained by the well-known method disclosed, for example, in the above-described Japanese Patent 2938431 or Published Unexamined Patent Application 11-296560.

The computer unit 100 is also used to display a wiring result received from the server computer 20 on the display device 102, etc. for the user.

As shown in FIG. 2, the server computer 20 comprises of a computer unit 200, a storage device 202, and a communication device 204.

The storage device 202 is used to store the wiring design software 3 shown in FIG. 3, information received from the client computer 10, wiring results, etc., and output the stored data to the computer unit 200 by request.

The communication device 204, just like the communication device 114, is used to perform data transmission between the client computer 10 and the server computer 20 via the communication line 18 under the control of the computer unit 200.

The computer unit 200, just like the computer unit 100, comprises of a CPU, a memory, and their peripheral circuits, and controls each component of the server computer 20.

Further, the computer unit 200 loads the wiring design software 3 shown in FIG. 3 from the storage device 202 into its memory and executes the software 3, as described below, to generate multi-terminal nets automatically according to the information received from the client computer 10 and output the generated nets to the client computer 10 as a wiring result.

Next, processing of the wiring design software 3 executed in the server computer 20 to generate multi-terminal nets automatically will be described. In this specification, the bonding pads, pins, vias, and plated terminals described above are collectively referred to as "terminals", and further referred to as "parts" 0also including wiring inhibited areas. A wiring inhibited area means an area where no wiring is allowed, such as an area located under the chip disposed on the package. The area is specified by the part information output from the client computer 10.

The present invention defines the following data structure for each net information.

(1) Connection terminal group (N1)
(2) Minimum value among layer level values of the connection terminal group (N2)
(3) Maximum value among the layer level values of the connection terminal group (N3)
(4) Values indicating a wiring arrangement order (N4) For data N1, a connection terminal group indicated by the initial net information received from the client computer 10 is registered as it is. Data N2 and N3 hold the minimum and maximum values among the, layer level values of the connection terminals, respectively. Data N4 is defined in a later process. The layer levels of data N2 and N3, and the wiring arrangement order in data N4 will be described later.

Figure 4:
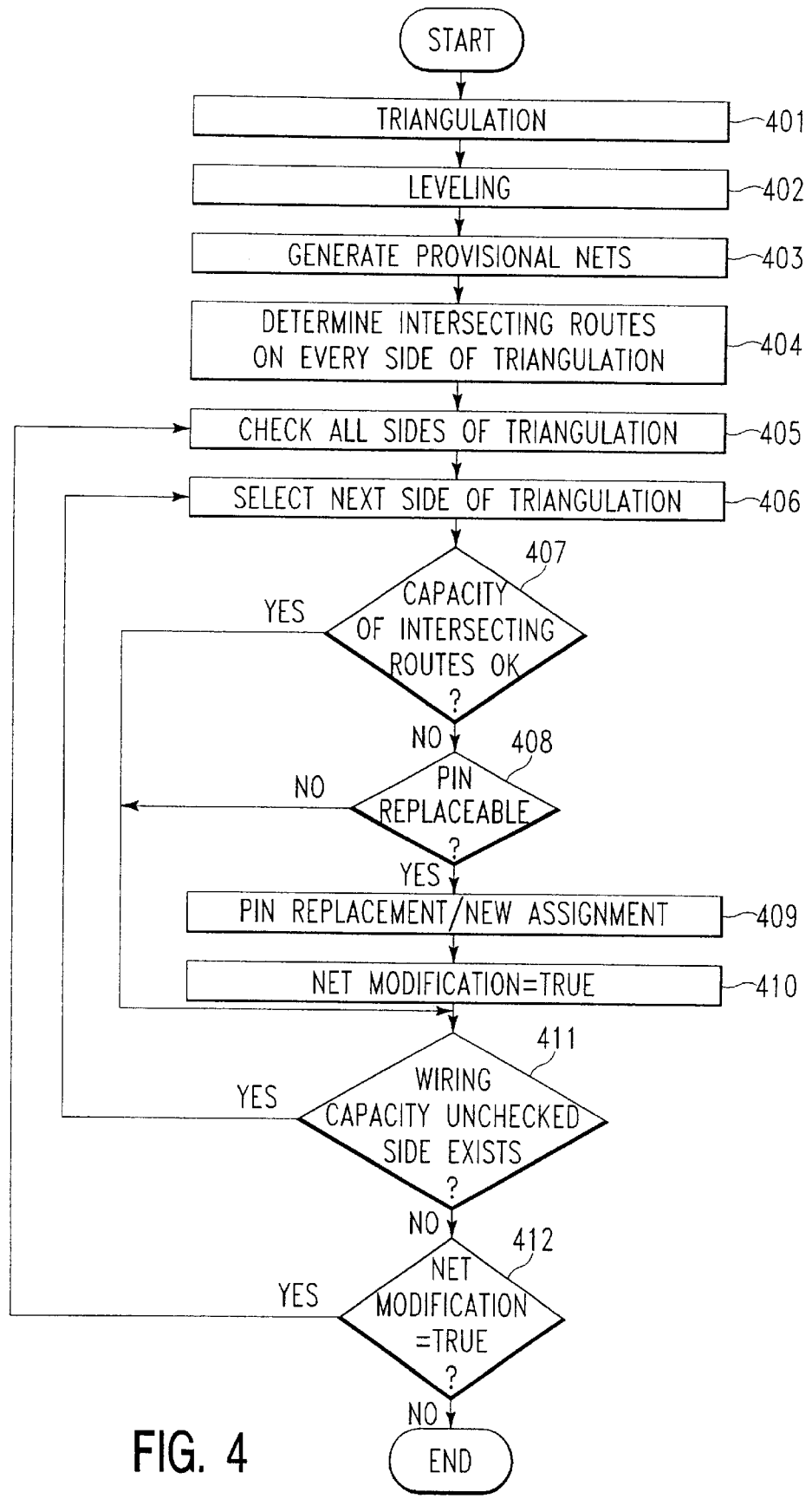
FIG. 4 is a flowchart illustrating a process for automatically generating multi-terminal nets according to the present invention.

FIG. 4 shows an overall flow of automatic multi-terminal net generation according to the present invention. The process shown in FIG. 4 is started when the initial information for generating the multi-terminal nets is received from the client computer 10. As described above, this initial information includes part information relating to each terminal identified by a part number, two-terminal net data between pats and pins, and design rules for a package. The part information includes an attribute indicating whether or not the part or terminal is pin replaceable, in addition to a part number. The pin replacement will be described later.

In the first step 401, the Delaunay triangulation is performed by taking leach part on the package into consideration. This processing is to represent the entire wiring surface of the package by triangles having, as vertexes, constituent parts such as pads and pins, and is used to determine any passing route on each side of the triangulation (hereinafter referred to as "triangulation side"). The Delaunay triangulation itself is a well-known technique as disclosed in Japanese Patent 2938431 referenced above.

Figure 5:
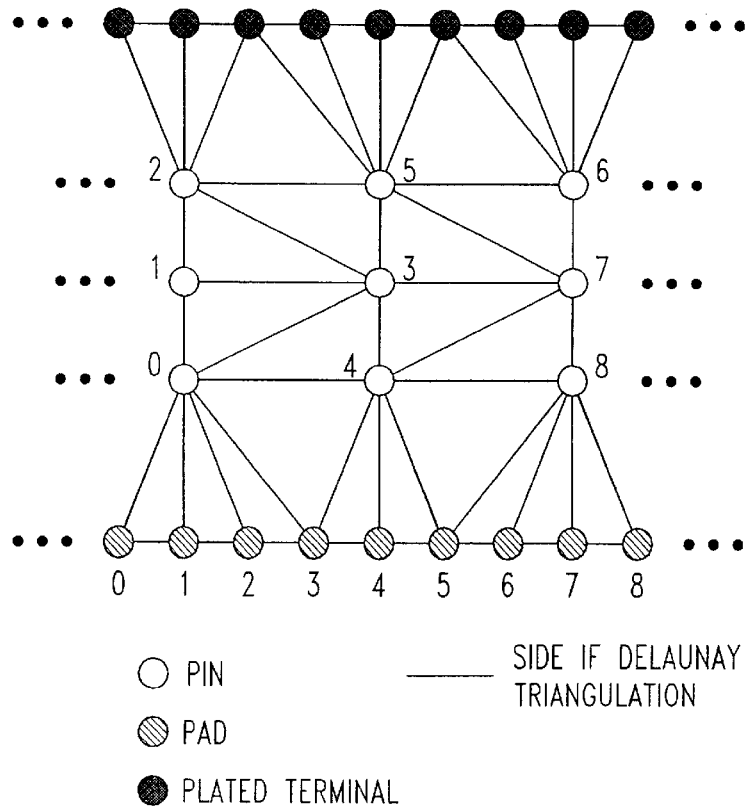
FIG. 5 illustrates Delaunay's triangles obtained by the triangulation shown in FIG. 4.

FIG. 5 shows a simple example of the Delaunay triangulation performed for pads, pins, and plated terminals.

Generally, pads are arranged around a chip (not shown) located at the center of the package, pins are arranged in a plurality of lines (three lines in the illustrated example) in the outer side relative to the pads, and plated terminals are arranged along the outer periphery of the package. It should be noted that, in the Delaunay triangulation, there is no triangulation side connecting directly the innermost pad to the outermost plated terminal. Numbers 0, 1, 2, . . . assigned to the respective terminals indicate a wiring arrangement order in which a pad having a given number is connected to a pin having the same given number. This information is obtained from the two-terminal net data received from the client computer 10. The outermost plated terminals are not yet given any numbers indicating the wiring arrangement order at this time (but unique part numbers are given) because nets will be hereafter generated for the plated terminals. The wiring design software 3 obtains, from the Delaunay triangulation, information indicating for each part any other part with which it shares a triangulation side.

When the Delaunay triangulation ends, the flow goes to step 402 to perform layering or leveling of the parts. This layering produces a data structure in which all the parts on the wiring surface have the respective layer level values which are greater as the parts are further from the base parts (pads in this embodiment). This may be done as follows according to the method disclosed in Japanese Patent 2938431 referenced above.

Figure 6:
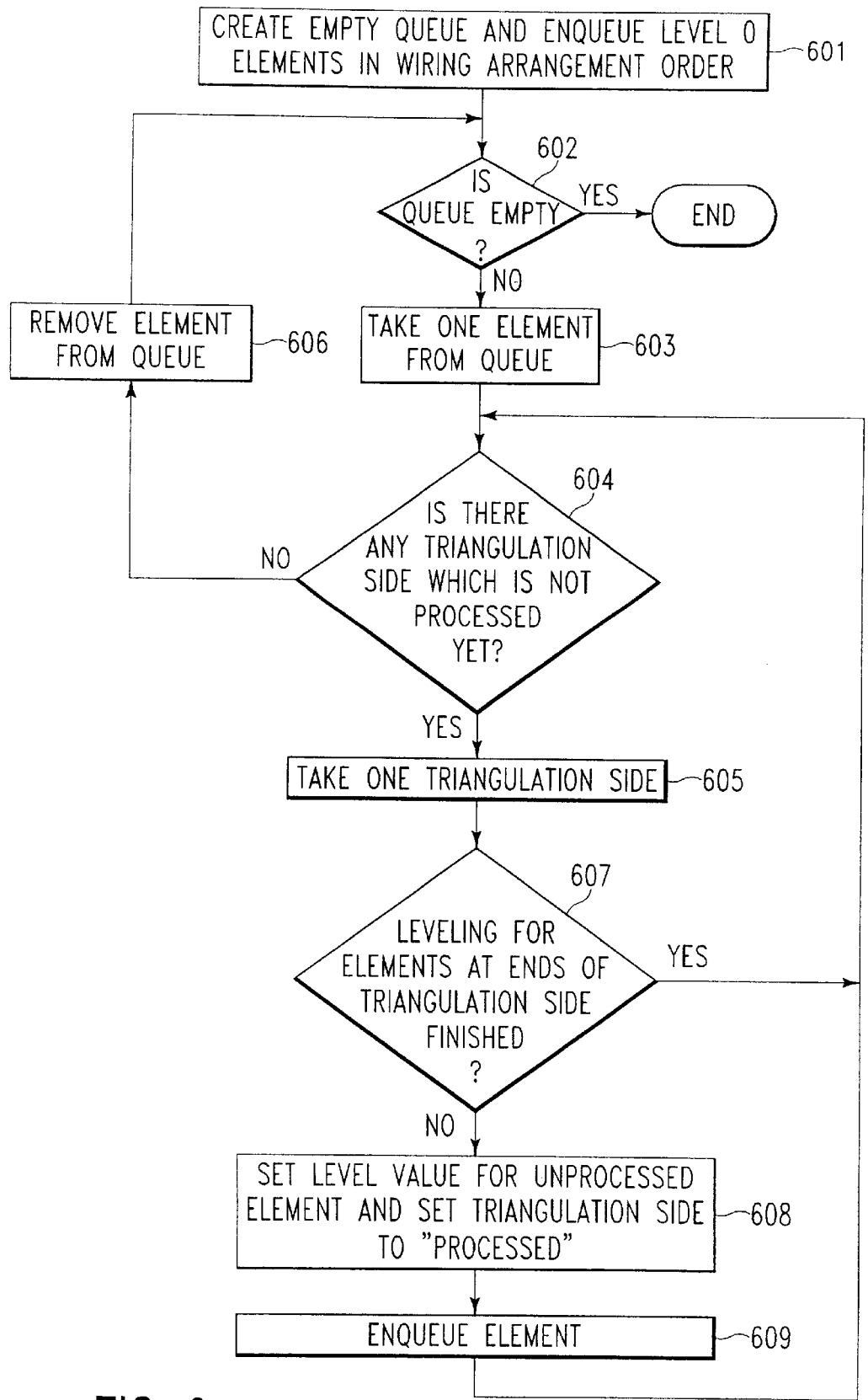
FIG. 6 is a flowchart for the layering shown in FIG. 4.

FIG. 6 is a flowchart for the layering (leveling) 402 shown in FIG. 4. As shown in FIG. 6, in the first step 601, the wiring design software 3 creates an empty queue in an FIFO format having a data structure for storing terminals to be connected, initializes a layer level of each terminal (level 0 for pads, and level −1 for others), and enqueues the level 0 pads as queue elements according to their wiring arrangement order (see FIG. 5).

In step 602, the wiring design software 3 checks whether the queue is empty. The software 3 ends the leveling if the queue is empty, otherwise goes to the next step 603 to take one element (assumed to be P) from the queue in preparation for leveling. Taken first is an element which represents the No. 0 pad shown in FIG. 5.

In step 604, the wiring design software 3 checks among the triangulation sides having, as an end point, the element P taken in step 603 (the sides can be identified by the information obtained in the triangulation) if there is any triangulation side (unprocessed triangulation side E) for which leveling is not yet performed. The wiring design software 3 goes to step 605 if there is a unprocessed triangulation side E, otherwise removes the element P from the queue in step 606, and then returns to step 602.

In step 605, the wiring design software 3 takes one unprocessed triangulation side E having, as the respective ends, the element taken in step 603 or element P which is a target of leveling and another element (assumed to be R).

In step 607, the wiring design software 3 checks whether the element R included in the triangulation side E as an end point is already leveled, that is, if the level of the element R is not equal to an undefined value (−1). The wiring design software 3 returns to step 604 if the element R is leveled (its level value is not −1), otherwise (level value is −1) goes to step 608.

In step 608, the wiring design software 3 levels the element R to a level (P+1; R), which is one level higher than that of the element P (level P). The element R is an end point of the triangulation side E taken in step 605. The software 3 then stores the triangulation side E and an index value of the triangulation side E (sum of the level values of both end elements P and R; P+R=2P+1) in association with each other. In addition, the software 3 changes a class of the triangulation side E with both end elements being leveled from "unprocessed" to "processed".

In step 609, the wiring design software 3 enqueues the element R for which a level is set, and then returns to step 604.

By repeating the above process for each element in the queue, layer level values of all parts on the wiring surface are obtained. While an FIFO queue is used for layering in the example of FIG. 6, the elements may also be held in the form of a list. In that case, elements of layer level 0 are followed by elements of layer levels 1, 2, . . . sequentially. When the list is used, steps 602 and 606 in FIG. 6 are not required, and a next element in the list is fetched if NO branch is taken from step 604.

Returning to FIG. 4, when the above-described leveling or layering is finished, the flow proceeds to the next step 403 to generate provisional three-terminal nets. Generally, wiring of a chip package must be done in such a way that its wiring direction is uniform (either from the center to the outer periphery or from the outer periphery to the center) and redundant routes such as detours or roundabout routes are not included. Considering this condition in terms of the layer level and wiring arrangement described above, the wiring is done in a direction of ascending order of the layer level values starting from 0, and passes each layer level in the same arrangement just once. If the wiring passes the same layer level several times, a redundant roundabout route would be generated, resulting in inadequate package wiring.

This is also true for the generation of N-terminal nets. Specifically, for a route, generated in the net generation for an N-th terminal (in the above example, a route between a pin and a plated terminal), the wiring arrangement on each of the layer levels 1, 2, should be identical to that of the layer level 0. Taking this into consideration, the two-terminal net generation for a pad of layer level 0 and a plated terminal of layer level n is performed with the existing algorithm as described in the background art section. In this case, however, a group of intermediate terminals (pins) is ignored. In this net generation, it is important for a route to pass each layer level uniformly in the same wiring arrangement. That is, when the same wiring arrangement is maintained (without including any redundant route), it is important what kind of nets are configured between the pads and plated terminals, and there is no need to satisfy the design rule in any intermediate route. Consequently, this processing ignores or loosens the design rule (wiring width, distance to a part) to generate nets by using the shortest route method and eliminating any intersection or crossing.

Figure 7:
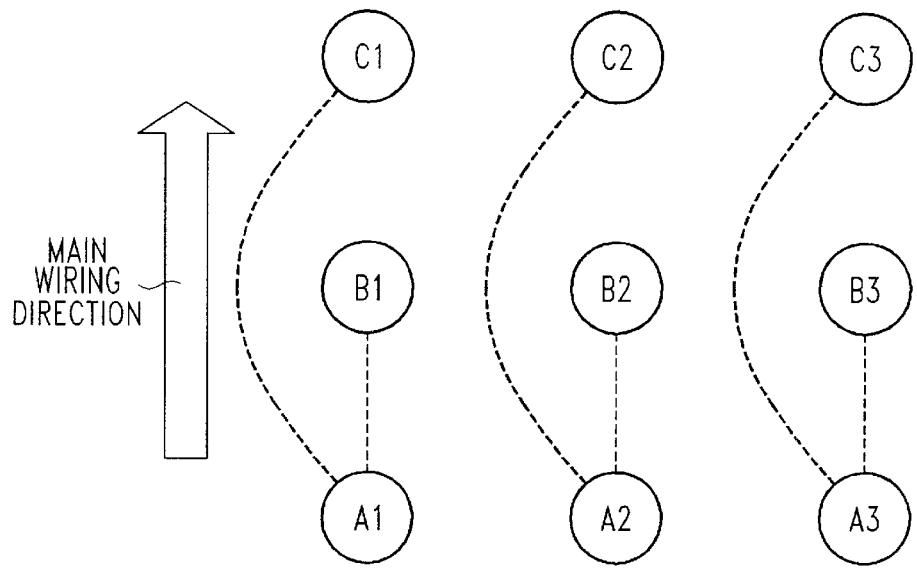
FIG. 7 shows how provisional nets are generated according to the present invention.

Explaining with reference to a simple example shown in FIG. 7, when three-terminal nets are to be generated, two-terminal net generation is performed from a group of terminals (pads) A1, A2, and A3 serving as wiring start parts to a different group of terminals (plated terminals) C1, C2, and C3 serving as wiring end parts to 0thereby generate nets A1–C1, A2–C2, and A3–C3. At this time, data of two-terminal nets A1–B1, A2–B2, and A3–B3 (given from the client computer 10 as initial data) between the wiring start terminal group and intermediate terminal (pin) group are ignored. Finally, the two-terminal nets Ai–Ci obtained in this way is combined with the given nets Ai–Bi to thereby generate provisional three-terminal nets Ai–Bi–Ci (i=1, 2, 3). As described above, the terminals Ai, Bi, and Ci constituting the provisional nets have the same number indicating the wiring arrangement order. In other words, the plated terminals Ci are given the same number as that of Ai and Bi.

Thus, data N1 to N4 in the above-described data structure (NET) are updated accordingly.

If nets are generated from the intermediate terminal group toward the wiring end terminal group, a roundabout route might be included in the solution for connection depending on the generated routes. This is the reason why the 0net generation from the intermediate terminal group Bi is not performed in the above-described two-terminal net generation. Also, the design rule is loosed on the two-terminal net generation for the same reason.

Figure 8:
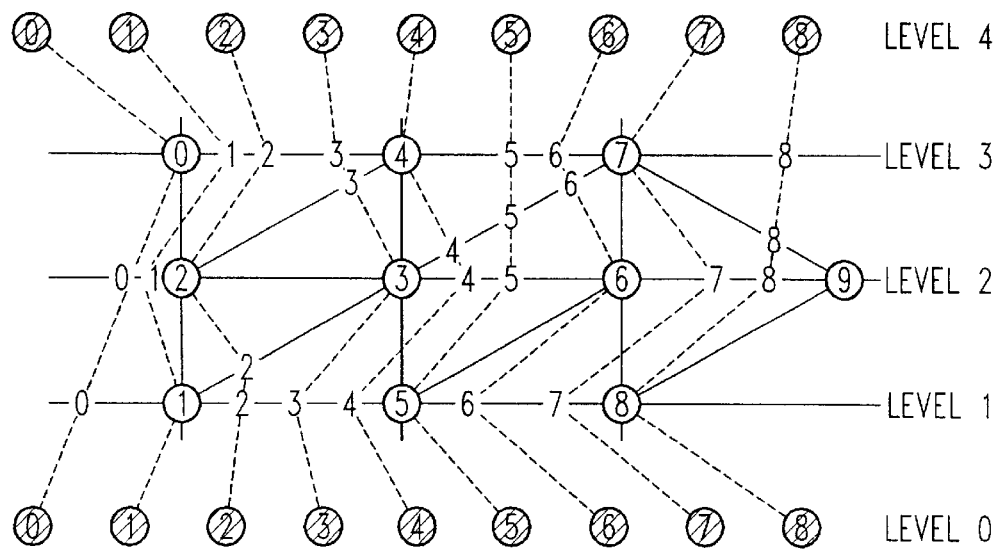
FIG. 8 shows how intersecting routes are determined on a triangulation side.

When the generation of the provisional nets is finished, the software 3 goes to step 404 to determine intersecting routes on every triangulation side. Explaining with reference to a simple example shown in FIG. 8, a pad, pin (or via), and plated terminal having the same wiring arrangement number are connected so that a wiring arrangement order is maintained on each triangulation side. For example, the routes whose numbers are 2, 3, and 4, respectively, pass (cross) the triangulation side between the No. 1 and No. 5 pins at level 1, thereby maintaining the wiring arrangement order 1 to 5. In other words, assuming that the wiring arrangement numbers of the terminals at both ends of a specific triangulation side are i and j, respectively, routes having numbers i+1, i+2, . . . j−1 are determined as the intersecting routes on this triangulation side in step 404. After executing this processing for every triangulation side, the wiring design software 3 proceeds to step 405 and succeeding steps to check if the provisional nets satisfy the design rule.

The wiring design software 3 lists all the triangulation sides for checking in step 405, sequentially takes those triangulation sides in step 406, and checks whether the capacity of the intersecting routes on the triangulation side taken in step 406 does not exceed the design rule in step 407. For example, if the design rule permits up to three intersecting routes and the number of intersecting routes determined in step 404 is two, then the decision in step 407 is OK and the software 3 proceeds to step 411. However, if the number of intersecting routes is four, the software 3 proceeds to step 408 to check whether the parts located at both ends of that triangulation side are pin replaceable so as to satisfy the design rule, that is, make the number of intersecting routes on that triangulation side to three or less. As described above, the part information received from the client computer includes attribute information indicating whether each part is pin replaceable. Therefore, the software 3 checks this attribute information to make the decision in step 408.

If pin replaceable, the wiring design software 3 proceeds to step 409, otherwise to step 411. Step 409 either replaces with each other two associated parts at both ends of the triangulation side which is intersected by a number of routes exceeding the capacity if nets have been assigned to the associated parts, or performs new net assignment if one or both of the parts at both ends of the triangulation side which is intersected by a number of routes exceeding the capacity.

Figure 9:
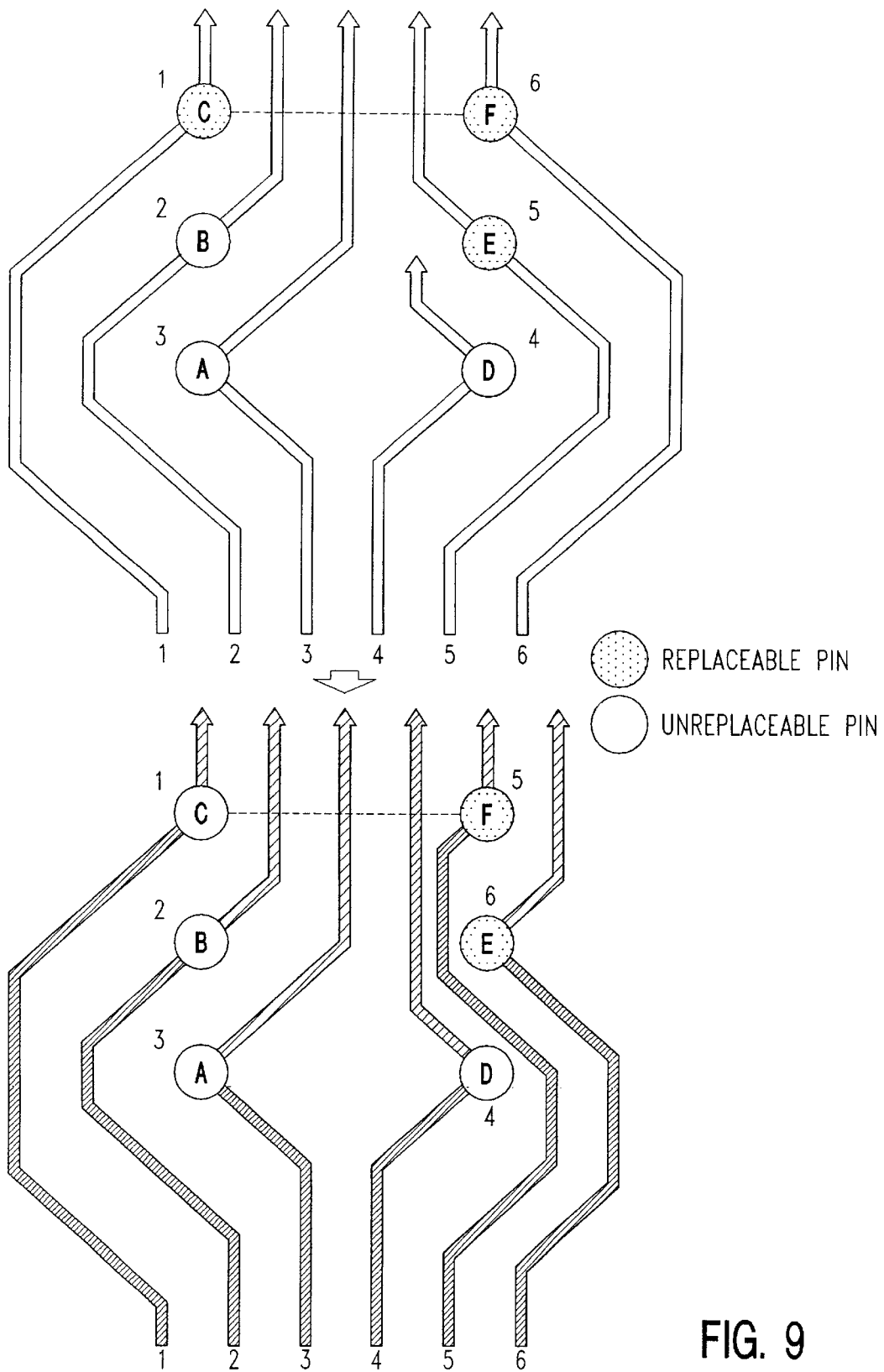
FIG. 9 shows how provisional nets are modified by pin replacement so as to satisfy a design rule.
Figure 10:
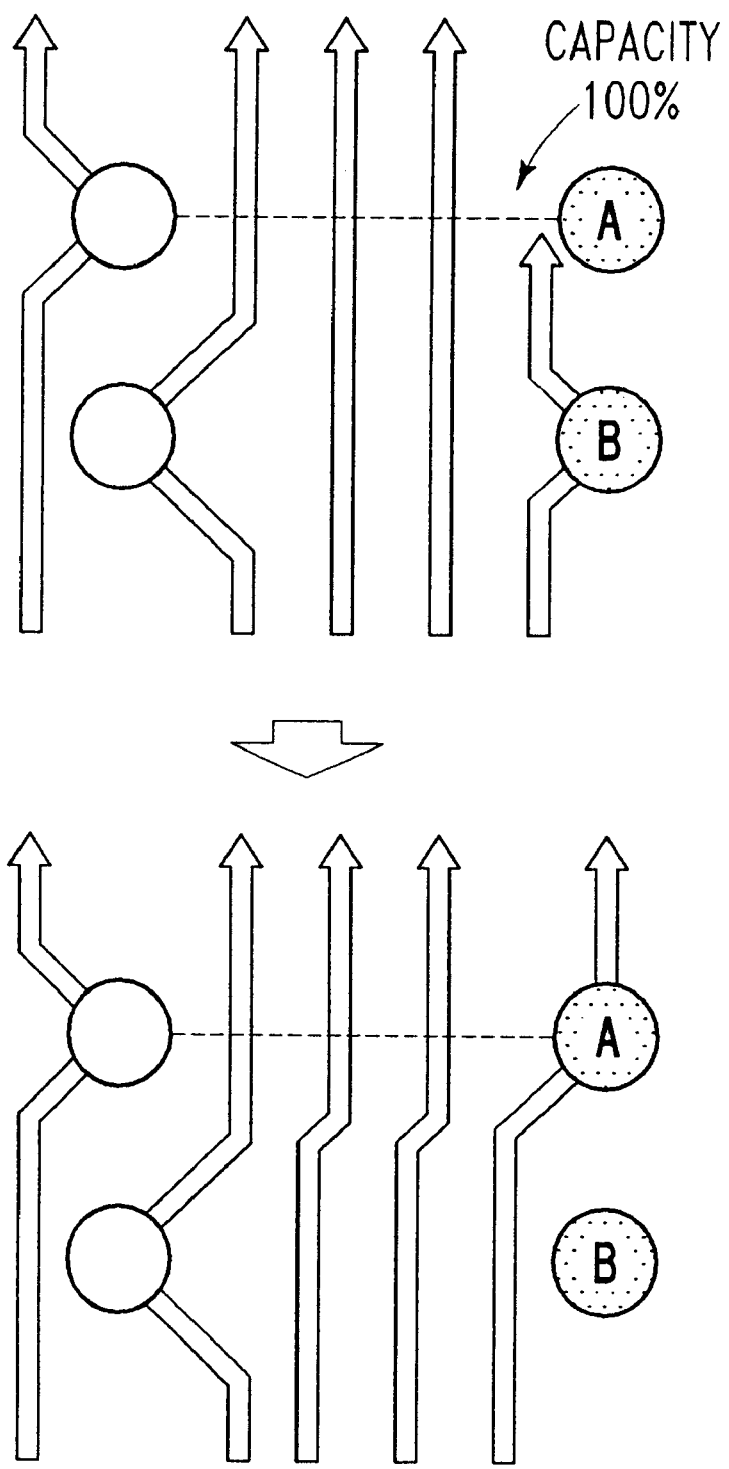
FIG. 10 shows how provisional nets are modified by new pin assignment so as to satisfy the design rule.

FIGS. 9 and 10 show examples of pin replacement and new net assignment, respectively. In the pin replacement shown in FIG. 9, four routes 2 to 5 pass between the parts C and F, although the capacity (number of routes which can pass) is 3. Therefore, the software 3 first checks whether the parts C and F have a pin replaceable attribute in step 408. In this example, it is assumed that only the part F has the pin replaceable attribute. Since a net (route 6) is assigned to the part F, the software 3 checks on a triangulation side between the parts C and F whether any part in the same group (e.g. pin group) as that of the part F and on a route nearest to the part F has the pin replaceable attribute to determine whether the part F can be replaced with another part. In the example shown in FIG. 9, the part E of the route 5 has the pin replaceable attribute. Therefore, the software 3 checks whether any redundant route is generated due to the replacement of F with E. If no redundant route is generated, the software 3 replaces F with E, and then goes to step 410. The generation of such a redundant route will be described later.

In the example of the new net assignment shown in FIG. 10, no net is assigned to the part A positioned at one end of a triangulation side on which routes pass the number of which exceeds the capacity. In this case, the software 3 checks whether the part A has the pin replaceable attribute in step 408 and, if it has, checks on this triangle triangulation side whether a different part belonging to the group of the part A on a route nearest to the part A also has the pin replaceable attribute. In the example shown in FIG. 10, since the part B in the group of the part A has the pin replaceable attribute, the software 3 checks whether a redundant route is generated due to the replacement of the part A with the part B. If no redundant route is generated, the software 3 replaces A with B. and then goes to step 410.

Since two parts are replaced with each other in both pin replacement shown in FIG. 9 and new net assignment shown in FIG. 10, the above-described data N1 to N4 must be updated accordingly.

Next, a technique for suppressing the generation of a redundant route will be described with reference to FIG. 11. In FIG. 11 (A), the capacity of allowable intersecting routes on the triangulation side between the parts A and D is exceeded. Therefore, the software 3 attempts to replace the part B with the part D by first examining the route arrangement on the layer level (X+1). As shown in FIG. 11(B), however, the route arrangement 5–6–7 would be changed to 6–5–7 on the layer level (X+1) if the part B is replaced with the part D. Since the arrangement order is not maintained, this replacement is not permitted. The situation shown in FIG. 11 (B) occurs since the route 6 once intersects the layer level (X+1) and then returns to the same layer level at the part B. In step 409, therefore, either the pin replacement or new net assignment is performed to prevent such a redundant route from being generated.

In step 410, a net modification flag is set to "TRUE" which indicates that the provisional nets have been modified.

In step 411, the wiring design software 3 checks whether there is any triangulation side for which the wiring capacity is not checked yet. If such a side exists, the software 3 returns to step 406. Otherwise, the software 3 goes to step 412 to check the status of the net modification flag. If the flag is set to "TRUE", the software 3 returns to step 405 to check all triangulation sides again. If the flag is not set to "TRUE" indicating that no net has been modified, the process shown in FIG. 4 is terminated.

Finally, a description will be made for a measure to be taken for a possibility that there is a part which is not initialized with its wiring arrangement number in the generation of the provisional nets in step 403 shown in FIG. 4 since it does not belong to any NET data while a net can be assigned to the part.

In the automatic generation of the multi-terminal nets, it is indispensable to initialize parts with their wiring arrangement order in the route identification processing following the generation of the provisional nets. Therefore, the part as described above must be initialized with a certain number. In such a case, it is possible to collect values of the end points of triangulation sides relating to the part and assign a temporary value thereto.

Figure 12:
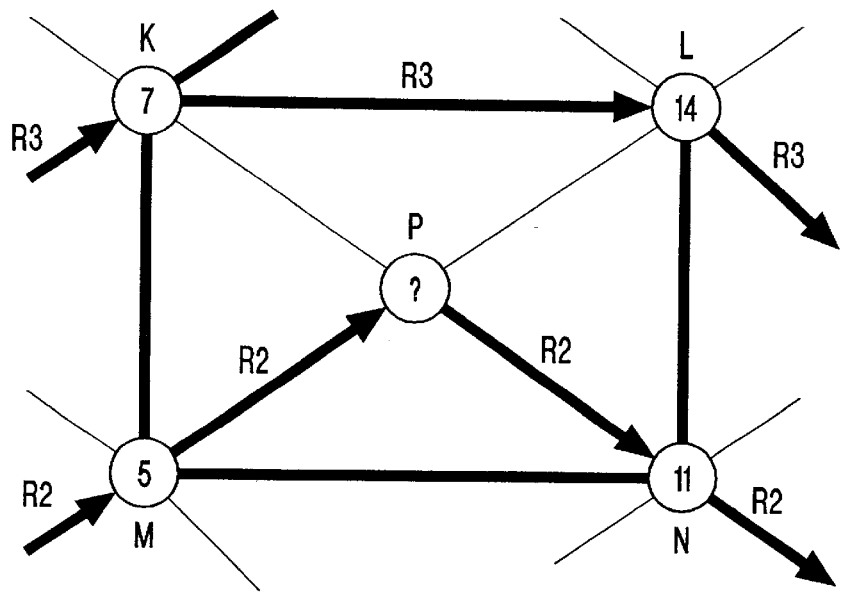
FIG. 12 illustrates one technique for assigning a wiring arrangement number to a part to which no assignment has been made in the generation of the provisional nets.

For example, to initialize the part P shown in FIG. 12, the layer levels and initial values of the parts K, L, M, and N surrounding the part P are collected. Especially, priority is given to the initial values (M:5, N:11) of the parts connected by the sides R2 of the layer level (level 2 in this example) to which the part P belongs to calculate an optimum value to be assigned to the part P. For the part OP shown in FIG. 12, the calculated optimum value is "8" (median).

Figure 13:
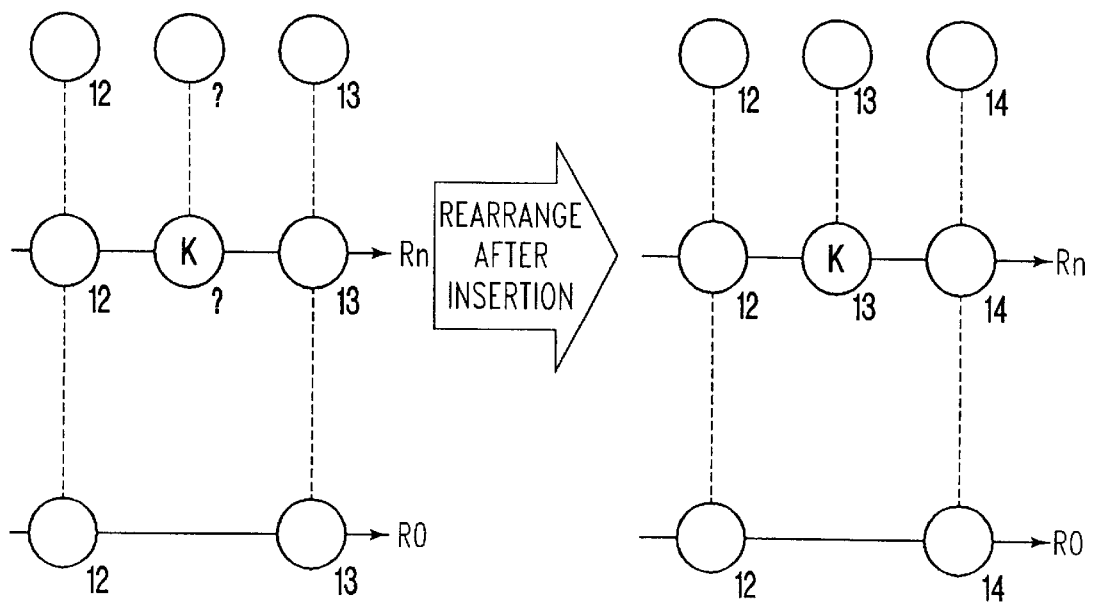
FIG. 13 illustrates another technique for assigning a wiring arrangement number to a part to which no assignment has been made in the generation of the provisional nets.

In FIG. 13, if the part K serving as a wiring start point exists in the layer level 2 on 0the wiring surface, data N4 (wiring arrangement number) of a net to which the part K belongs is not initialized since the part K does not have any route which intersects the side R0 on the layer level 0. Unless a number is assigned thereto, however, the static route identification method cannot be applied. Therefore, the data N4 to which the part K belongs is determined by the following method.

Before applying the first static route identification method using the provisional nets, a temporary number is assigned to all connection terminals involving the part K by treating them as the above-described parts to which no net has been assigned, and then the first static route identification method is applied. Then, it is determined what routes are passing around the connection terminals of the net to which the part K belongs among the routes obtained by the route deriving with use of the provisional net0s. If the twelfth and thirteenth routes pass with a part (i.e. part K) existing therebetween which has the lowest layer level among the connection terminals of the net to which the part K belongs, the numbers of the thirteenth and succeeding nets are incremented by one, respectively, and the net of the part K is defined newly as the thirteenth net. Thereafter, the processing is advanced by assuming the data N4 of the part K as 13. Once the number to be assigned is determined, new insertion and re-sorting are done dynamically for all the net elements.

When the automatic multi-terminal generation technique of the present invention was actually used to generate three-terminal nets, it took about ten minutes to complete the process including automatic wiring after the net generation. Even a skillful designer could need more than eight hours to complete the wiring design manually. Therefore, it is to be understood that the above-described objects of the present invention are achieved satisfactorily.

While the preferred embodiments of the present invention have been described, it is to be understood that the present invention should not be limited thereto, and various changes and modifications may be made. For example, while the three-terminal nets are generated in the above embodiments, four-terminal nets may also be generated by inputting, as the initial data, the three-terminal net information generated in the above embodiments. The following process may be the one shown in FIG. 4.

What is claimed is:

1. A method for automatically generating multi terminal nets in a package having a plurality of terminal groups, said method comprising the steps of:
   (a) inputting a set of initial data, said initial data comprising wiring data between a first terminal group having wiring start terminals and a second terminal group in proximity to the first terminal group;
   (b) performing a two terminal net generation said generation comprising interacting said first terminal group and a third terminal group proximal to said second terminal group, said generation not including said second terminal group;
   (c) generating provisional nets by combining said initial data with the result of said two terminal net generation such that predetermined package design rules are satisfied.

2. The method according to claim 1 wherein step (c) is iterative.

3. The method according to claim 1 wherein steps a, b and c are repeated for other package terminal groups where the set of initial data is the calculated provisional net data from the previous provisional net generation.

4. The method according to claim 2 wherein steps a, b and c are repeated for other package terminal groups where the set of initial data is the calculated provisional net data from the previous provisional net generation.

5. The method according to claim 4 wherein said package includes a wiring inhibited area as a part in additional to said plurality of terminal groups.

6. The method according to claim 5 wherein prior to performing step (b) a Delaunay triangulation for the parts on said package is performed and the parts are layered.

7. The method according to claim 6 wherein the iteration of step c comprises the steps of:
   (c1) determining any intersecting route on every triangulation side generated by said Delaunay triangulation;
   (c2) checking for each triangulation side whether a predetermined intersecting route capacity is exceeded;
   (c3) replacing a part located at an end point of that triangulation side with an associated part on a different route passing nearest to said part to be replace on said triangulation side if said predetermined intersecting route capacity is exceeded.

8. The method of claim 6 wherein said iteration of step c comprises the steps of:
   (c1) determining any intersecting route on every triangulation side generated by said Delaunay triangulation;
   (c2) checking for each triangulation side whether a predetermined intersecting route capacity is exceeded;
   (c3) replacing a part located at an end point of that triangulation side and having no assigned net with an associated part on a different route passing nearest to said part to e replace on said triangulation side is said predetermined intersecting rout capacity is exceeded.

9. The method according to claim 7 further comprising the step of checking whether said part located at the end point of said triangulation side is pin replaceable when said predetermined intersecting route capacity is exceeded.

10. The method according to claim 8 further comprising the step of checking whether said part located at the end point of said triangulation side is pin replaceable when said predetermined intersecting route capacity is exceeded.

11. An apparatus for automatically generating multi terminal nets in a package having a plurality of terminal groups, said method comprising the steps of:
   (a) means for inputting a set of initial data, said initial data comprising wiring data between a first terminal group having wiring start terminals and a second terminal group in proximity to the first terminal group;
   (b) means for performing two terminal net generation said generation comprising interacting said first terminal group an d a third terminal group proximal to said second terminal group, said generation not including said second terminal group;
   (c) means for generating iterative provisional nets by combining said initial data with the result of said two terminal net generation such that predetermined package design rules are satisfied and wherein steps (b) and can be repeated at least once using the previous generation provisional net as the initial data.

12. The apparatus according to claim 11, wherein said package includes a wiring inhibited area as a part in addition to said plurality of terminal groups.

13. The apparatus according to claim 11 further comprising the means for performing the Delaunay triangulation for the parts on said package is performed and a means for layering each of said parts.

14. The apparatus according to claim 13 wherein the iteration of step c comprises the steps of:
(c1) means for determining any intersecting route on every triangulation side generated by said Delaunay triangulation;
(c2) means for checking for each triangulation side whether a predetermined intersecting route capacity is exceeded;
(c3) means for replacing a part located at an end point of that triangulation side with an associated part on a different route passing nearest to said part to be replace on said triangulation side if said predetermined intersecting route capacity is exceeded.

15. The apparatus according to claim 13 wherein the iteration of step c comprises the steps of:
(c1) means for determining any intersecting route on every triangulation side generated by said Delaunay triangulation;
(c2) means for checking for each triangulation side whether a predetermined intersecting route capacity is exceeded;
(c3) means for replacing a part located at an end point of that triangulation side and having no assigned net with an associated part on a different route passing nearest to said part to e replace on said triangulation side is said predetermined intersecting rout capacity is exceeded.

16. The apparatus according to claim 14 further comprising a means for checking whether said part located at the end point of said triangulation side is pin replaceable when said predetermined intersecting route capacity is exceeded.

17. The apparatus according to claim 15 further comprising a means for checking whether said part located at the end point of said triangulation side is pin replaceable when said predetermined intersecting route capacity is exceeded.

18. A program storage device readable by a machine, tangibly embodying a program of instructions executable by the machine to perform method steps for a method for automatically generating multi terminal nets in a package having a plurality of terminal groups, said method steps comprising:
a) inputting a set of initial data, said initial data comprising wiring data between a first terminal group having wiring start terminals and a second terminal group in proximity to the first terminal group;
b) performing a two terminal net generation said generation comprising interacting said first terminal group and a third terminal group proximal to said second terminal group said generation not including said second terminal group;
c) generating provisional nets by combining said initial data with the result of said two terminal net generation such that predetermined package design rules are satisfied.

* * * * *